United States Patent
Miura et al.

(10) Patent No.: US 12,106,974 B2
(45) Date of Patent: Oct. 1, 2024

(54) METHOD FOR MANUFACTURING ELECTRONIC DEVICE

(71) Applicant: MITSUI CHEMICALS TOHCELLO, INC., Tokyo (JP)

(72) Inventors: Toru Miura, Nagoya (JP); Hiroyoshi Kurihara, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 440 days.

(21) Appl. No.: 17/438,650

(22) PCT Filed: Feb. 27, 2020

(86) PCT No.: PCT/JP2020/008092
§ 371 (c)(1),
(2) Date: Sep. 13, 2021

(87) PCT Pub. No.: WO2020/184201
PCT Pub. Date: Sep. 17, 2020

(65) Prior Publication Data
US 2022/0189791 A1    Jun. 16, 2022

(30) Foreign Application Priority Data
Mar. 14, 2019  (JP) ................. 2019-046776

(51) Int. Cl.
*H01L 21/56*    (2006.01)
*B32B 7/12*    (2006.01)
(Continued)

(52) U.S. Cl.
CPC .............. *H01L 21/568* (2013.01); *B32B 7/12* (2013.01); *B32B 27/08* (2013.01); *B32B 37/12* (2013.01);
(Continued)

(58) Field of Classification Search
CPC ..... H01L 21/568; H01L 21/561; H01L 24/13; H01L 24/16; H01L 2224/13111;
(Continued)

(56) References Cited

U.S. PATENT DOCUMENTS 8,436,482 B2    5/2013  Yamaguchi
10,515,839 B2   12/2019 Kurihara
(Continued)

FOREIGN PATENT DOCUMENTS

JP    2011134811 A    7/2011
JP    5348360 B1      11/2013
(Continued)

OTHER PUBLICATIONS

Extended European Search Report issued Nov. 16, 2022, by the European Patent Office in corresponding European Patent Application No. 20769648.5. (8 pages).
(Continued)

*Primary Examiner* — Mohammad A Rahman
(74) *Attorney, Agent, or Firm* — BUCHANAN, INGERSOLL & ROONEY PC

(57) ABSTRACT

A method for manufacturing an electronic device includes at least a preparing step of preparing a structure provided with an adhesive film provided with a base material layer, an adhesive resin layer (A) provided on a first surface side of the base material layer, an adhesive resin layer (B) provided on a second surface side of the base material layer and in which an adhesive force is reduced by external stimuli, and an unevenness-absorbing resin layer (C) provided between the base material layer and the adhesive resin layer (A) or between the base material layer and the adhesive resin layer (B), an electronic component attached to the adhesive resin layer (A) of the adhesive film and having an uneven structure, and a support substrate attached to the adhesive resin
(Continued)

layer (B) of the adhesive film; and a sealing step of sealing the electronic component with a sealing material.

9 Claims, 2 Drawing Sheets

(51) Int. Cl.
*B32B 27/08* (2006.01)
*B32B 37/12* (2006.01)
*C09J 7/38* (2018.01)

(52) U.S. Cl.
CPC ......... *C09J 7/385* (2018.01); *B32B 2307/732* (2013.01); *B32B 2457/00* (2013.01); *C09J 2203/326* (2013.01); *C09J 2423/00* (2013.01); *C09J 2425/00* (2013.01); *C09J 2433/00* (2013.01); *C09J 2475/00* (2013.01); *C09J 2483/00* (2013.01)

(58) Field of Classification Search
CPC . H01L 2224/13113; H01L 2224/13116; H01L 2224/13139; H01L 2224/13144; H01L 2224/13147; H01L 2224/16225; H01L 2224/81191; H01L 2224/96; H01L 2224/97; H01L 21/563; H01L 23/12; H01L 21/56; B32B 7/12; B32B 27/08; B32B 37/12; B32B 2307/732; B32B 2457/00; C09J 7/385; C09J 2203/326; C09J 2423/00; C09J 2425/00; C09J 2433/00; C09J 2475/00; C09J 2483/00; C09J 7/30; C09J 2301/1242; C09J 7/29; C09J 133/08; C09J 133/10; C09J 133/12; C09J 175/04; C09J 7/38; C09J 123/00; C09J 125/04; C09J 133/00; C09J 183/04; C09J 83/04

See application file for complete search history.

(56) References Cited

U.S. PATENT DOCUMENTS

| 2007/0182898 | A1 | 8/2007 | Yamaoka et al. |
| 2011/0151625 | A1 | 6/2011 | Hoshino et al. |
| 2014/0322474 | A1 | 10/2014 | Usugi et al. |
| 2019/0267273 | A1 | 8/2019 | Kurihara |

FOREIGN PATENT DOCUMENTS

| JP | 2018-006541 | * | 6/2016 |
| JP | 2018-006541 A | * | 6/2016 |
| JP | 2016-155919 A | | 9/2016 |
| JP | 3442010 B1 | * | 3/2017 |
| JP | P 2018157037 A | * | 3/2017 |
| JP | 2018157037 A | | 10/2018 |
| TW | 200621929 A | | 7/2006 |
| WO | 2017170452 A1 | | 10/2017 |
| WO | 2018021145 A1 | | 2/2018 |

OTHER PUBLICATIONS

International Search Report (PCT/ISA/210) with an English translation, and Written Opinion (PCT/ISA/237) mailed on Apr. 7, 2020, by the Japanese Patent Office as the International Searching Authority for International Application No. PCT/JP2020/008092.

* cited by examiner

METHOD FOR MANUFACTURING ELECTRONIC DEVICE

TECHNICAL FIELD

The present invention relates to a method for manufacturing an electronic device.

BACKGROUND ART

As a technology which is able to reduce the size and weight of electronic devices (for example, semiconductor apparatuses), a fan-out type WLP (wafer level package) is being developed.

In an eWLB (Embedded Wafer Level Ball Grid Array), which is one of the methods for manufacturing a fan-out type WLP, it is possible to adopt a method in which a plurality of electronic components such as semiconductor chips are temporarily fixed in a separated state on an adhesive film attached to a support substrate, and the plurality of electronic components are sealed in a batch with a sealing material. Here, the adhesive film needs to be fixed to the electronic component and the support substrate in the sealing step or the like and needs to be removed from the sealed electronic component and the support substrate after the sealing.

Examples of a technique related to such a fan-out type WLP manufacturing method include the technique described in Patent Document 1 (Japanese Patent Laid-Open No. 2011-134811).

Patent Document 1 discloses a heat-resistant adhesive sheet for manufacturing a semiconductor apparatus, which is used by being attached when resin-sealing a substrateless semiconductor chip, in which the heat-resistant adhesive sheet has a base material layer and an adhesive layer, and the adhesive layer has an adhesive force to SUS304 after bonding of 0.5 N/20 mm or more, is cured by a stimulus received until the completion of a resin sealing step, and has a peel force with respect to a package of 2.0 N/20 mm or less.

RELATED DOCUMENT

Patent Document

[Patent Document 1] Japanese Patent Laid-Open No. 2011-134811

SUMMARY OF THE INVENTION

Technical Problem

According to studies by the inventors of the present invention, it was clear that, when electronic components having an uneven structure such as bumps, for example, are arranged on an adhesive film and the electronic components are sealed with a sealing material, the position of the electronic components may shift (also referred to below as position shifting of the electronic components) or sealing defects may occur due to the sealing material penetrating between the adhesive film and the electronic component.

The present invention is made in consideration of the above circumstances and provides a method for manufacturing an electronic device with which it is possible to suppress position shifting of electronic components and sealing defects in a sealing step.

Solution to Problem

The inventors of the present invention carried out intensive studies in order to achieve the above object. As a result, it was found that using an adhesive film provided with an unevenness-absorbing resin layer as an adhesive film makes it possible to suppress position shifting of electronic components and sealing defects in a sealing step, thereby completing the present invention.

According to the present invention, a method for manufacturing an electronic device illustrated below is provided.

[1]

A method for manufacturing an electronic device, the method including at least a preparing step of preparing a structure provided with an adhesive film provided with abase material layer, an adhesive resin layer (A) provided on a first surface side of the base material layer and used for temporarily fixing an electronic component, an adhesive resin layer (B) provided on a second surface side of the base material layer and in which an adhesive force is reduced by external stimuli, and an unevenness-absorbing resin layer (C) provided between the base material layer and the adhesive resin layer (A) or between the base material layer and the adhesive resin layer (B), an electronic component attached to the adhesive resin layer (A) of the adhesive film and having an uneven structure, and a support substrate attached to the adhesive resin layer (B) of the adhesive film, and a sealing step of sealing the electronic component with a sealing material.

[2]

The method for manufacturing an electronic device according to [1], in which the unevenness-absorbing resin layer (C) is provided at least between the base material layer and the adhesive resin layer (A).

[3]

The method for manufacturing an electronic device according to [1] or [2], in which the uneven structure of the electronic component includes a bump electrode.

[4]

The method for manufacturing an electronic device according to [3], in which, when a height of the bump electrode is defined as H [μm] and a thickness of the unevenness-absorbing resin layer is defined as d [μm], H/d is 0.01 or more and 1 or less.

[5]

The method for manufacturing an electronic device according to any one of [1] to [4], in which the unevenness-absorbing resin layer includes a thermoplastic resin.

[6]

The method for manufacturing an electronic device according to any one of [1] to [5], in which a thickness of the unevenness-absorbing resin layer is 10 μm or more and 1000 μm or less.

[7]

The method for manufacturing an electronic device according to any one of [1] to [6], further including a first peeling step of peeling the support substrate from the structure by reducing an adhesive force of the adhesive resin layer (B) by applying an external stimulus, after the sealing step.

[8]

The method for manufacturing an electronic device according to [7], further including a second peeling step of peeling the adhesive film from the electronic component, after the first peeling step.

[9]

The method for manufacturing an electronic device according to any one of [1] to [8], in which the sealing material is an epoxy resin-based sealing material.

[10]

The method for manufacturing an electronic device according to any one of [1] to [9], in which an adhesive resin forming the adhesive resin layer (A) includes one or two or more selected from a (meth)acrylic-based adhesive resin, a silicone-based adhesive resin, a urethane-based adhesive resin, an olefin-based adhesive resin, and a styrene-based adhesive resin.

Advantageous Effects of Invention

According to the present invention, it is possible to provide a method for manufacturing an electronic device with which it is possible to suppress position shifting of electronic components and sealing defects in a sealing step.

DESCRIPTION OF EMBODIMENTS

Figure 1:
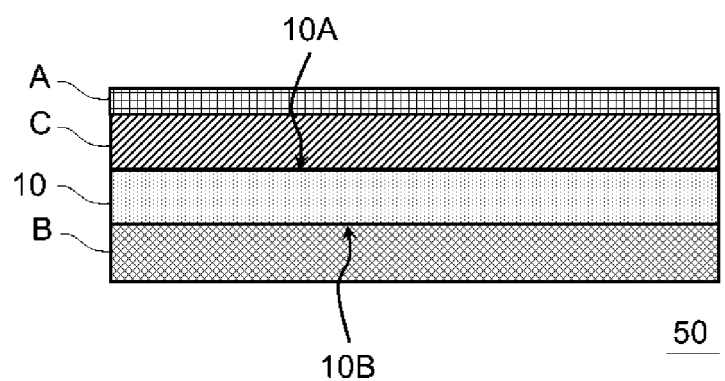
FIG. 1 is a cross-sectional view schematically showing an example of a structure of an adhesive film of an embodiment according to the present invention.

A description will be given below of embodiments of the present invention with reference to the drawings. In all the drawings, common reference numerals are given to the same constituent components and description thereof will not be repeated. In addition, the figures are schematic views and do not match the actual dimensional ratios. In addition, unless otherwise specified, "A to B" in the numerical range represents A or more and B or less. In addition, in the present embodiment, "(meth)acrylic" means acrylic, methacrylic, or both acrylic and methacrylic.

1. Method for Manufacturing Electronic Device

Figure 2:
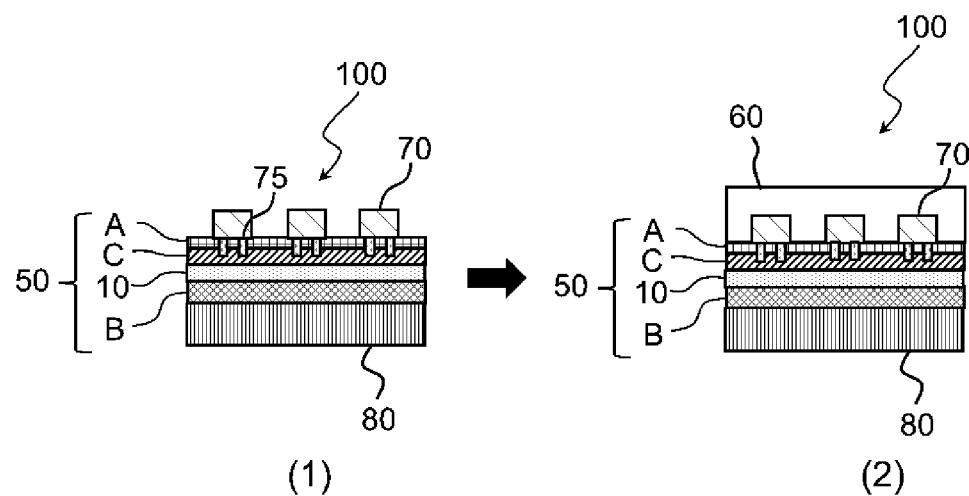
FIG. 2 is a cross-sectional view schematically showing an example of a method for manufacturing an electronic device of an embodiment according to the present invention.
Figure 3:
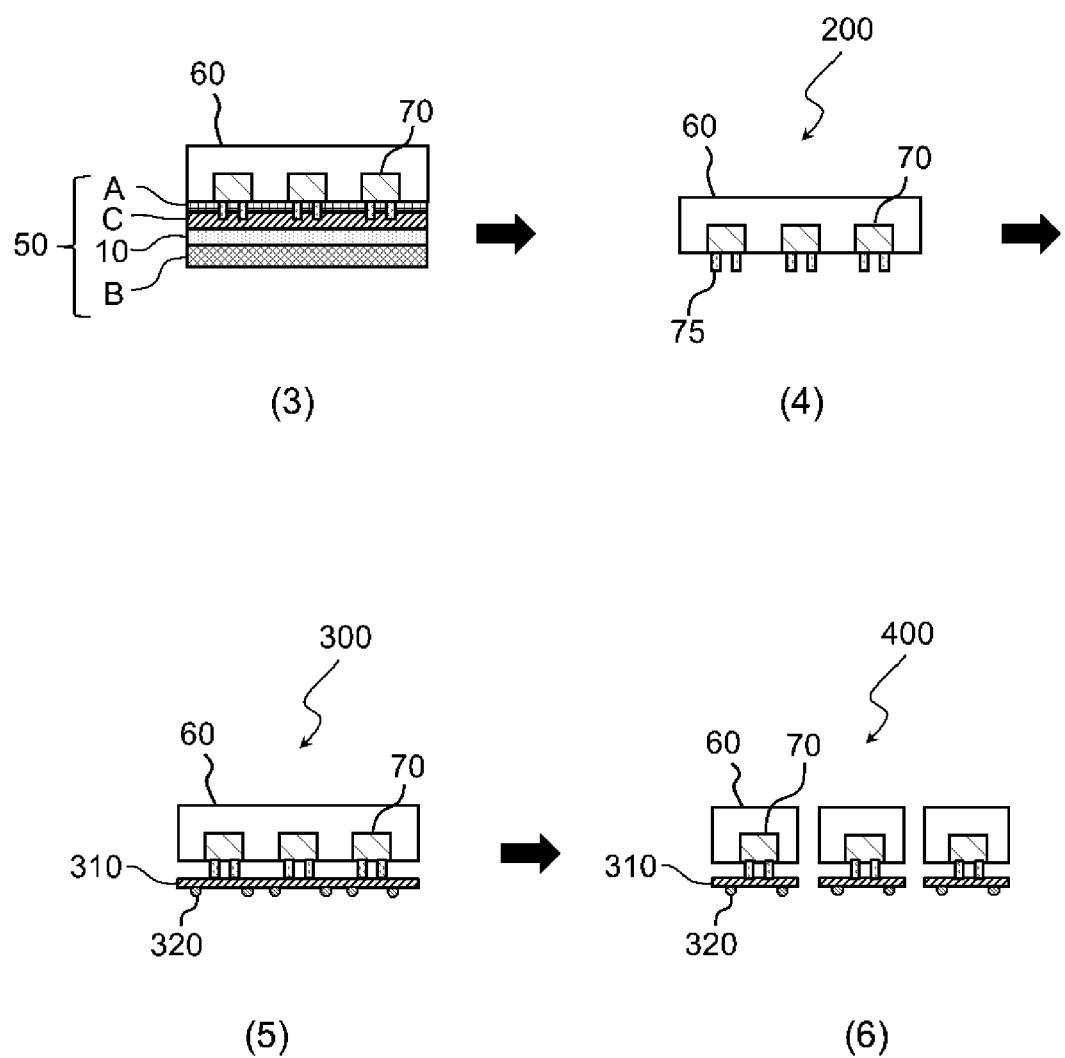
FIG. 3 is a cross-sectional view schematically showing an example of a method for manufacturing an electronic device of an embodiment according to the present invention.

First, a description will be given of the method for manufacturing an electronic device according to the present embodiment. FIG. 1 is a cross-sectional view schematically showing an example of the structure of an adhesive film 50 of the embodiment according to the present invention. FIG. 2 and FIG. 3 are cross-sectional views schematically showing an example of a method for manufacturing an electronic device of an embodiment according to the present invention.

The method for manufacturing an electronic device according to the present embodiment is provided with at least the following two steps.

(1) A preparing step of preparing a structure 100 provided with the adhesive film 50 provided with a base material layer 10, the adhesive resin layer (A) provided on a first surface 10A side of the base material layer 10 and used for temporarily fixing an electronic component 70, the adhesive resin layer (B) provided on a second surface 10B side of the base material layer 10 and in which an adhesive force is reduced by external stimuli, and the unevenness-absorbing resin layer (C) provided between the base material layer 10 and the adhesive resin layer (A) or between the base material layer 10 and the adhesive resin layer (B), the electronic component 70 attached to the adhesive resin layer (A) of the adhesive film 50 and having an uneven structure 75, and a support substrate 80 attached to the adhesive resin layer (B) of the adhesive film 50

(2) A sealing step of sealing the electronic component 70 with a sealing material 60

As described above, according to studies by the inventors of the present invention, it was clear that, when electronic components having an uneven structure such as bumps, for example, are arranged on an adhesive film and the electronic components are sealed with a sealing material, the position of the electronic components may shift (also referred to below as position shifting of the electronic components) or sealing defects may occur due to the sealing material penetrating between the adhesive film and the electronic component.

The inventors of the present invention carried out intensive studies to resolve the above problems. As a result, it was found that electronic components having an uneven structure such as bumps have insufficient adhesion to the adhesive film, and as a result, in a step of sealing the electronic components, position shifting of the electronic components, which are not able to withstand the pressure caused by the flow of the sealing material, may occur, or sealing defects may occur due to the sealing material penetrating between the adhesive film and the electronic components.

Based on the above findings, the inventors of the present invention carried out further studies. As a result, it was found for the first time that providing the unevenness-absorbing resin layer (C) between the base material layer 10 and the adhesive resin layer (A) or between the base material layer 10 and the adhesive resin layer (B) improves the adhesion between the electronic component having an uneven structure and the adhesive film and makes it possible to suppress position shifting of the electronic components or the generation of sealing defects in the sealing step.

That is, according to the method for manufacturing an electronic device according to the present embodiment, by using the adhesive film 50 having the unevenness-absorbing resin layer (C) as an adhesive film used for temporarily fixing the electronic component 70 having the uneven structure 75, the adhesion of the adhesive film 50 with respect to the electronic component 70 having the uneven structure 75 is improved, thus, in the step of sealing the electronic component, it is possible to suppress the position of the electronic component 70 from shifting due to pressure or the like caused by the flow of the sealing material 60 or the sealing material from penetrating between the adhesive film and the electronic component.

As described above, according to the method for manufacturing an electronic device according to the present embodiment, it is possible to suppress position shifting and sealing defects of the electronic component in the sealing step.

A description will be given below of each step of the method for manufacturing an electronic device according to the present embodiment.

((1) Preparing Step)

In the preparing step, the structure 100 provided with the adhesive film 50, the electronic component 70 attached to the adhesive resin layer (A) of the adhesive film 50 and having the uneven structure 75, and the support substrate 80 attached to the adhesive resin layer (B) of the adhesive film 50 is prepared.

It is possible to manufacture the structure 100, for example, by the following procedure.

First, the adhesive film 50 is attached on the support substrate 80 such that the adhesive resin layer (B) is on the support substrate 80 side. A protective film called a separator may be attached on the adhesive resin layer (B) and it is possible to peel the protective film and attach the exposed surface of the adhesive resin layer (B) to the surface of the support substrate 80.

As the support substrate 80, for example, it is possible to use a quartz substrate, a glass substrate, a SUS substrate, or the like.

Next, it is possible to obtain the structure 100 by arranging the electronic component 70 on the adhesive resin layer (A) of the adhesive film 50 attached on the support substrate 80.

Examples of the electronic component 70 include a semiconductor chip such as an IC, LSI, discrete component, light emitting diode, or light receiving element, a semiconductor panel, a semiconductor package, and the like.

The surface of the electronic component 70 has the uneven structure 75, for example, by having electrodes.

In addition, the electrodes are, for example, bonded with respect to the electrodes formed on the mounting surface when the electronic device is mounted on the mounting surface, so as to form an electrical connection between the electronic device and the mounting surface (mounting surface of a printed substrate or the like).

Examples of electrodes include bump electrodes such as ball bumps, printing bumps, stud bumps, plating bumps, pillar bumps, and the like. That is, the electrode is usually a convex electrode. These bump electrodes maybe used alone as one type or 2 or more types may be used in combination.

In addition, the type of the metal forming the bump electrode is not particularly limited and examples thereof include silver, gold, copper, tin, lead, bismuth, alloys thereof, and the like. These metal types may be used alone as one type or two or more types may be used in combination.

(2) Sealing Step

Next, the electronic component 70 is sealed with the sealing material 60.

The electronic component 70 is covered by the sealing material 60 and the sealing material 60 is cured at, for example, a temperature of 150° C. or lower to seal the electronic component 70.

In addition, the form of the sealing material 60 is not particularly limited, but is, for example, granular, sheet-like, or liquid-like.

The sealing material 60 is not particularly limited, but, for example, it is possible to use an epoxy resin-based sealing material using an epoxy resin.

In particular, a liquid-like epoxy resin-based sealing material is preferable in terms of the affinity of the sealing material 60 to the adhesive film 50 being more favorable and being able to seal the electronic component 70 more evenly.

As such an epoxy resin-based sealing material, for example, it is possible to use the T693/R4000 series, the T693/R1000 series, the T693/R5000 series, and the like, manufactured by Nagase ChemteX Corporation.

Examples of sealing methods include transfer molding, injection molding, compression molding, casting molding, and the like. After sealing the electronic component 70 with the sealing material 60, the sealing material 60 is cured by heating at, for example, a temperature of 150° C. or lower to obtain the structure 100 in which the electronic component 70 is sealed.

((3) First Peeling Step)

In the method for manufacturing an electronic device according to the present embodiment, as shown in FIG. 3, after the sealing step of (2), a first peeling step of peeling the support substrate 80 from the structure 100 by reducing the adhesive force of the adhesive resin layer (B) by applying an external stimulus thereto may be further provided.

It is possible to easily remove the support substrate 80 from the adhesive film 50 by, for example, sealing the electronic components 70 and then heating at a temperature over 150° C. to reduce the adhesive force of the adhesive resin layer (B).

((4) Second Peeling Step)

In the method for manufacturing an electronic device according to the present embodiment, as shown in FIG. 3, after the first peeling step, a second peeling step of peeling the adhesive film 50 from the electronic component 70 to obtain an electronic device 200 may be further provided.

Examples of the method for peeling the adhesive film 50 from the electronic component 70 include a mechanical peeling method, a method of peeling after reducing the adhesive force on the surface of the adhesive film 50, or the like.

(Other Steps)

In the method for manufacturing an electronic device according to the present embodiment, as shown in FIG. 3, a step (5) of forming a wiring layer 310 and bumps 320 on the exposed surface of the obtained electronic device 200 to obtain an electronic device 300 may be further provided.

The wiring layer 310 is provided with pads (not shown), which are external connection terminals formed on the outermost surface, and wiring (not shown), which electrically connects the exposed electronic component 70 to the pads. The wiring layer 310 is able to be formed by methods known in the related art and may be a multilayer structure.

Then, it is possible to form bumps 320 on the pads of the wiring layer 310 and obtain the electronic device 300. Examples of the bumps 320 include solder bumps, gold bumps, or the like. It is possible to form solder bumps, for example, by arranging a solder ball on the pad, which is an external connection terminal of the wiring layer 310, and heating and melting (reflowing) the solder. It is possible to form gold bumps by methods such as a ball bonding method, a plating method, and an Au ball transfer method.

In addition, in the method for manufacturing an electronic device according to the present embodiment, as shown in FIG. 3, a step (6) of dicing the electronic device 300 to obtain a plurality of electronic devices 400 may be further provided.

It is possible to perform the dicing of the electronic device 300 by a known method.

2. Adhesive Film

A description will be given below of the adhesive film 50 according to the present embodiment.

FIG. 1 is a cross-sectional view schematically showing an example of the structure of the adhesive film 50 of the embodiment according to the present invention.

As shown in FIG. 1, the adhesive film 50 according to the present embodiment is provided with the base material layer 10, the adhesive resin layer (A) provided on the first surface 10A side of the base material layer 10 and used for temporarily fixing the electronic component 70, the adhesive resin layer (B) provided on the second surface 10B side of the base material layer 10 and in which an adhesive force is reduced by external stimuli, and the unevenness-absorbing resin layer (C) provided between the base material layer 10 and the adhesive resin layer (A) or between the base material layer 10 and the adhesive resin layer (B).

From the viewpoint of making the unevenness-absorbing property of the adhesive film 50 more favorable, the unevenness-absorbing resin layer (C) is preferably positioned at least between the base material layer 10 and the adhesive resin layer (A).

In a case where the unevenness-absorbing resin layer (C) is positioned between the base material layer 10 and the adhesive resin layer (A), another unevenness-absorbing resin layer (C') may be further provided between the adhesive resin layer (B) and the base material layer 10, and, in this case, the unevenness-absorbing resin layer (C) and the unevenness-absorbing resin layer (C') maybe similar or different in material, thickness, and the like.

From the viewpoint of the balance between mechanical properties and handleability, the total thickness of the adhesive film 50 according to the present embodiment is preferably 10 µm or more and 1000 µm or less, and more preferably 20 µm or more and 500 µm or less.

Next, a description will be given of each layer forming the adhesive film 50 according to the present embodiment.

<Base Material Layer>

The base material layer 10 is a layer provided for the purpose of making the characteristics such as the handling, mechanical properties, heat resistance, and the like of the adhesive film 50 more favorable.

The base material layer 10 is not particularly limited and examples thereof include a resin film.

As the resin forming the resin film described above, it is possible to use a known thermoplastic resin. Examples thereof include one type or two or more types selected from polyolefins such as polyethylene, polypropylene, poly(4-methyl-1-pentene), and poly(1-butene); polyesters such as polyethylene terephthalate, polybutylene terephthalate, and polyethylene naphthalate; polyamides such as nylon-6, nylon-66, and polymetaxylene adipamide; polyacrylates; polymethacrylates; polyvinyl chlorides; polyvinylidene chlorides; polyimides; polyetherimides; ethylene vinyl acetate copolymers; polyacrylonitrile; polycarbonates; polystyrenes; ionomers; polysulfones; polyethersulfone; polyphenylene ether, and the like.

Among these, from the viewpoint of an excellent balance between the transparency, mechanical strength, price, and the like, one type or two or more types selected from polypropylene, polyethylene terephthalate, polyethylene naphthalate, polyamide, and polyimide are preferable, and at least one type selected from polyethylene terephthalate and polyethylene naphthalate is more preferable.

The base material layer 10 may be a single layer or a layer of two or more types.

In addition, the form of the resin film used to form the base material layer 10 may be a stretched film or a film stretched in the uniaxial or biaxial direction; however, from the viewpoint of improving the mechanical strength of the base material layer 10, a film stretched in the uniaxial or biaxial direction is preferable.

From the viewpoint of obtaining favorable film properties, the thickness of the base material layer 10 is preferably 1 µm or more and 500 µm or less, more preferably 5 µm or more and 300 µm or less, and even more preferably 10 µm or more and 250 µm or less.

The base material layer 10 maybe subjected to a surface treatment in order to improve the adhesion with other layers. Specifically, a corona treatment, a plasma treatment, an undercoat treatment, a primer coat treatment, and the like may be performed.

<Adhesive Resin Layer (A)>

The adhesive resin layer (A) is a layer provided on one surface side of the base material layer 10, for example, for contacting the surface of the electronic component to temporarily fix the electronic component when the electronic component is sealed with a sealing material in the electronic device manufacturing steps.

The adhesive resin layer (A) includes an adhesive resin (A1).

Examples of the adhesive resin (A1) include a (meth) acrylic-based adhesive resin (a), a silicone-based adhesive resin, a urethane-based adhesive resin, an olefin-based adhesive resin, a styrene-based adhesive resin, and the like.

Among the above, the (meth)acrylic-based adhesive resin (a) is preferable from the viewpoint of facilitating the adjustment of the adhesive force and the like.

As the adhesive resin layer (A), it is also possible to use a radiation cross-linking adhesive resin layer in which the adhesive force is reduced by radiation. The radiation cross-linking adhesive resin layer is cross-linked by the irradiation of radiation and the adhesive force is significantly reduced, thus, the adhesive film 50 is easily peeled from the electronic component. Examples of the radiation include ultraviolet rays, electron beams, infrared rays, and the like.

As the radiation cross-linking adhesive resin layer, an ultraviolet cross-linking adhesive resin layer is preferable.

Examples of the (meth)acrylic-based adhesive resin (a) used in the adhesive resin layer (A) include a copolymer including a (meth)acrylic acid alkyl ester monomer unit (a1) and a monomer unit (a2) having a functional group capable of reacting with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (a) according to the present embodiment, for example, by copolymerizing a monomer mixture including a (meth) acrylic acid alkyl ester monomer (a1) and a monomer (a2) having a functional group capable of reacting with a cross-linking agent.

Examples of the monomer (a1) forming the (meth)acrylic acid alkyl ester monomer unit (a1) include a (meth)acrylic acid alkyl ester having an alkyl group having approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types. In the (meth)acrylic-based adhesive resin (a) according to the present embodiment, when the total of all the monomer units in the (meth)acrylic-based adhesive resin (a) is 100% by mass, the content of the (meth)acrylic acid alkyl ester monomer unit (a1) is preferably 10% by mass or more and 98.9% by mass or less, more preferably 50% by mass or more and 97% by mass or less, and even more preferably 85% by mass or more and 95% by mass or less.

Examples of the monomer (a2) forming the monomer unit (a2) having a functional group capable of reacting with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, and the like. Preferable are acrylic acid, methacrylic acid, 2-hydroxyethyl acrylate, 2-hydroxyethyl methacrylate, acrylamide, methacrylamide, and the like. These may be used alone or in a combination of two or more types.

In the (meth)acrylic-based adhesive resin (a) according to the present embodiment, when the total of all the monomer units in the (meth)acrylic-based adhesive resin (a) is 100% by mass, the content of the monomer unit (a2) is preferably 1% by mass or more and 40% by mass or less, more preferably 1% by mass or more and 20% by mass or less, and even more preferably 1% by mass or more and 10% by mass or less.

The (meth)acrylic-based adhesive resin (a) according to the present embodiment may, in addition to the monomer unit (a1) and the monomer unit (a2), further include a bifunctional monomer unit (a3) and a specific comonomer (referred to below as a polymerizable surfactant) unit having properties as a surfactant.

The polymerizable surfactant has a property of copolymerizing with the monomer (a1), the monomer (a2), and the monomer (a3), and also has an action as an emulsifier in the case of emulsion polymerization.

Examples of the monomer (a3) forming the bifunctional monomer unit (a3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or, for example, monomers in which the main chain structure is a propylene glycol type with diacrylate or dimethacrylate at both ends (for example, manufactured by NOF Corp., trade name: PDP-200, PDP-400, ADP-200, and ADP-400), tetramethylene glycol type monomers (for example, manufactured by NOF Corp., trade name: ADT-250 and ADT-850), mixtures thereof (for example, manufactured by NOF Corp., trade name: ADET-1800 and ADPT-4000), and the like.

In the (meth)acrylic-based adhesive resin (a) according to the present embodiment, when the total of all the monomer units in the (meth)acrylic-based adhesive resin (a) is 100% by mass, the content of the monomer unit (a3) is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (a) according to the present embodiment, when the total of all monomer units in the (meth)acrylic-based adhesive resin (a) is 100% by mass, the content of the polymerizable surfactant is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

The (meth)acrylic-based adhesive resin (a) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (a) according to the present embodiment include radical polymerization, anionic polymerization, cationic polymerization, and the like. In consideration of the manufacturing cost of the (meth)acrylic-based adhesive resin (a), the influence of the functional group of the monomer, the influence of ions on the surface of the electronic component, and the like, it is preferable to carry out the polymerization by radical polymerization.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (A) according to the present embodiment preferably further includes a cross-linking agent (A2) having two or more cross-linkable functional groups in one molecule, in addition to the adhesive resin (A1).

The cross-linking agent (A2) having two or more cross-linkable functional groups in one molecule is used to react with the functional group of the adhesive resin (A1) and adjust the adhesive force and aggregating force.

Examples of such a cross-linking agent (A2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcin diglycidyl ether; isocyanate-based compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine-based compounds such as trimethylolpropane-tri-β-aziridinylpropionate, tetramethylolmethane-tri-β-aziridinylpropionate, N,N'-diphenylmethane-4,4'-bis(1-aziridinecarboxamide), N,N'-hexamethylene-1,6-bis(1-aziridinecarboxamide), N,N'-toluene-2,4-bis(1-aziridinecarboxamide), and trimethylolpropane-tri-β-(2-methylaziridine) propionate; tetrafunctional epoxy-based compounds such as N,N,N',N'-tetraglycidyl-m-xylenediamine and 1,3-bis(N,N'-diglycidylaminomethyl) cyclohexane; and melamine-based compounds such as hexamethoxymethylolmelamine. These may be used alone or in a combination of two or more types.

Among the above, it is preferable to include one type or two or more types selected from an epoxy-based compound, an isocyanate-based compound, and an aziridine-based compound.

The content of the cross-linking agent (A2) is usually preferably in a range in which the number of functional groups in the cross-linking agent (A2) does not exceed the number of functional groups in the adhesive resin (A1). However, in a case where a functional group is newly generated in the cross-linking reaction, a case where the cross-linking reaction is slow, or the like, the content thereof may be greater as necessary. From the viewpoint of improving the balance between the heat resistance and the adhesive force of the adhesive resin layer (A), the content of the cross-linking agent (A2) in the adhesive resin layer (A) is preferably 0.1 parts by mass or more and 15 parts by mass or less with respect to 100 parts by mass of the adhesive resin (A1).

The adhesive resin layer (A) may include additives such as plasticizers and adhesion-imparting resins as other components. In a case where the adhesive resin layer (A) is a radiation cross-linking adhesive resin, various additives for radiation cross-linking may be included. The total content of the adhesive resin (A1) and the cross-linking agent (A2) in the adhesive resin layer (A) is preferably 50% by mass or more when the entire adhesive resin layer (A) is 100% by mass, more preferably 70% by mass or more, even more preferably 90% by mass or more, and particularly preferably 95% by mass or more. Due to this, it is possible to further suppress glue residue on the electronic component side when the adhesive film is peeled from the electronic component.

The thickness of the adhesive resin layer (A) is not particularly limited, but is, for example, preferably 1 μm or more and 100 μm or less, and more preferably 3 μm or more and 50 μm or less.

It is possible to form the adhesive resin layer (A), for example, by coating an adhesive on the base material layer 10 or the unevenness-absorbing resin layer (C). The adhesive maybe dissolved in a solvent and coated as a coating solution, coated as an aqueous emulsion, or directly coated as a liquid-like adhesive.

Among these, an adhesive coating solution dissolved in an organic solvent is preferable. The organic solvent is not particularly limited and may be appropriately selected from known organic solvents in consideration of solubility and drying time. Examples of organic solvents include ester-based organic solvents such as ethyl acetate and methyl acetate; ketone-based organic solvents such as acetone and MEK; aromatic-based organic solvents such as benzene, toluene, and ethylbenzene; linear or cyclic aliphatic-based organic solvents such as heptane, hexane, and cyclohexane; and alcohol-based organic solvents such as isopropanol and butanol. Ethyl acetate and toluene are preferable as the organic solvent. These solvents may be used alone as one type or used in a mixture of two or more types. As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (A) or the unevenness-absorbing resin layer (C) may be formed by coextrusion molding, or the film-like base material layer 10 and the film-like adhesive resin layer (A) may be formed by laminating.

<Adhesive Resin Layer (B)>

The adhesive film 50 according to the present embodiment is provided with the adhesive resin layer (B) for which the adhesive force is reduced by an external stimulus, on the second surface 10B side on the opposite side to the first surface 10A of the base material layer 10.

Due to this, it is possible to easily peel the adhesive film 50 from the support substrate 80 by applying an external stimulus.

Here, examples of the adhesive resin layer (B), the adhesive force of which is reduced by an external stimulus, include a heat-peelable adhesive resin layer, the adhesive force of which is reduced by heating, a radiation-peelable adhesive resin layer, the adhesive force of which is reduced by radiation, and the like. Among the above, a heat-peelable adhesive resin layer, the adhesive force of which is reduced by heating, is preferable.

Examples of the heat-peelable adhesive resin layer include adhesive resin layers formed of a heat-expandable adhesive including a gas generating component, a heat-expandable adhesive including heat-expandable microspheres capable of expanding to reduce the adhesive force, a heat-expandable adhesive, the adhesive force of which is reduced by the cross-linking reaction of the adhesive components by heat, or the like.

In the present embodiment, the heat-expandable adhesive used in the adhesive resin layer (B) is an adhesive, the adhesive force of which is reduced or lost by heating at a temperature over 150° C., for example. For example, it is possible to select a material which does not peel at a temperature of 150° C. or lower and which does peel at a temperature over 150° C. and which preferably has an adhesive force such that the adhesive film 50 does not peel from the support substrate 80 during the electronic device manufacturing steps.

Here, it is possible to evaluate the reduction or loss of the adhesive force by heating at a temperature over 150° C., for example, by the peeling strength from a stainless-steel plate, measured after attaching the adhesive resin layer (B) side to the stainless-steel plate, performing a heating treatment at 140° C. for one hour, and then heating at a temperature over 150° C. for two minutes. The specific heating temperature when heating at a temperature over 150° C. is set to a temperature higher than the temperature at which gas is generated or the temperature at which heat-expandable microspheres undergo heat expansion and is set as appropriate depending on the type of gas to be generated or the heat-expandable microspheres. In the present embodiment, loss of adhesive force means, for example, a case where the 180° peeling strength measured under conditions of 23° C. and a tensile speed of 300 mm/min is less than 0.5 N/25 mm.

As the gas generating component used in the heat-expandable adhesive, for example, it is possible to use an azo compound, an azide compound, a Meldrum's acid derivative, or the like. In addition, it is also possible to use inorganic foaming agents such as ammonium carbonate, ammonium hydrogen carbonate, sodium hydrogen carbonate, ammonium nitrite, sodium borohydride, and various azides, or water; salts of fluoroalkane-based compounds such as trichloromonofluoromethane and dichloromonofluoromethane; azo-based compounds such as azobisisobutyronitrile, azodicarbonamide, and barium azodicarboxylate; hydrazine-based compounds such as paratoluenesulfonyl hydrazide, diphenylsulfone-3,3'-disulfonylhydrazide, 4,4'-oxybis(benzenesulfonyl hydrazide) and allylbis (sulfonylhydrazide); semicarbazide-based compounds such as p-toluylenesulfonyl semicarbazide, and 4,4'-oxybis(benzenesulfonyl semicarbazide); triazole-based compounds such as 5-morpholyl-1,2,3,4-thiatriazole; organic foaming agents such as N-nitroso compounds such as N,N -dinitrosopentamethylenetetramine, and N,N'-dimethyl-N,N'-dinitrosoterephthalamide, and the like. The gas generating component may be added to the adhesive resin (B1) or may be directly bonded to the adhesive resin (B1).

As the heat-expandable microspheres used for the heat-expandable adhesive, for example, it is possible to use a microencapsulated foaming agent. Examples of such heat-expandable microspheres include microspheres in which a substance that is easily gasified and expanded by heating such as isobutane, propane, and pentane is sealed in a shell having elasticity, or the like. Examples of the material forming the shell include vinylidene chloride-acrylonitrile copolymer, polyvinyl alcohol, polyvinyl butyral, polymethyl methacrylate, polyacrylonitrile, polyvinylidene chloride, polysulfone, and the like. It is possible to manufacture heat-expandable microspheres by, for example, a coacervation method, an interfacial polymerization method, or the like.

It is possible to add heat-expandable microspheres to the adhesive resin.

It is possible to appropriately set the content of at least one type selected from the gas generating component and the heat-expandable microspheres according to the expansion ratio and the reduction in adhesive force of the heat-peelable adhesive resin layer (B) and the like without being particularly limited; however, for example, with respect to 100 parts by mass of the adhesive resin (B1) in the heat-peelable adhesive resin layer (B), the content is, for instance, 1 part by mass or more and 150 parts by mass or less, preferably 10 parts by mass or more and 130 parts by mass or less, and more preferably 12 parts by mass or more and 100 parts by mass or less.

It is preferable to implement the design such that the temperature at which gas is generated or the temperature at which the heat-expandable microspheres heat-expand is over 150° C.

Examples of the adhesive resin (B1) forming the heat-expandable adhesive include a (meth)acrylic-based resin (b), a urethane-based resin, a silicone-based resin, a polyolefin-based resin, a polyester-based resin, a polyamide-based resin, a fluorine-based resin, a styrene-diene block copolymer-based resin, and the like. Among these, the (meth)acrylic-based resin (b) is preferable.

Examples of the (meth)acrylic-based adhesive resin (b) used for the adhesive resin layer (B) include a copolymer including a (meth)acrylic acid alkyl ester monomer unit (b1) and a monomer unit (b2) having a functional group able to react with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (b) according to the present embodiment, for example, by copolymerizing a monomer mixture including a (meth)acrylic acid alkyl ester monomer (b1) and a monomer (b2) having a functional group able to react with a cross-linking agent.

The monomer (b1) forming the (meth)acrylic acid alkyl ester monomer unit (b1) includes (meth)acrylic acid alkyl esters having an alkyl group of approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types. In the (meth)acrylic-based adhesive resin (b) according to the present embodiment, the content of the (meth)acrylic acid alkyl ester monomer unit (b1) is preferably 10% by mass or more and 98.9% by mass or less when the total of all monomer units in the (meth)acrylic-based adhesive resin (b) is 100% by mass, more preferably 50% by mass or more and 97% by mass or less, and even more preferably 85% by mass or more and 95% by mass or less.

Examples of the monomers (b2) forming the monomer units (b2) having a functional group able to react with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, acrylic acid-2-hydroxyethyl, methacrylic acid-2-hydroxyethyl acrylate, acrylamide, methacrylamide, tert-butylaminoethyl acrylate, tert-butylaminoethyl methacrylate, and the like. Acrylic acid, methacrylic acid, acrylic acid-2-hydroxyethyl, methacrylic acid-2-hydroxyethyl, acrylamide, methacrylamide, and the like are preferable. These may be used alone or in a combination of two or more types.

In the (meth)acrylic-based adhesive resin (b) according to the present embodiment, the content of the monomer unit (b2) is preferably 1% by mass or more and 40% by mass or less when the total of all monomer units in the (meth)acrylic-based adhesive resin (b) is 100% by mass, more preferably 1% by mass or more and 20% by mass or less, and even more preferably 1% by mass or more and 10% by mass or less.

The (meth)acrylic-based adhesive resin (b) according to the present embodiment may further include, in addition to the monomer unit (b1) and the monomer unit (b2), a bifunctional monomer unit (b3) and a specific comonomer (referred to below as a polymerizable surfactant) unit having properties as a surfactant.

The polymerizable surfactant has a property of copolymerizing with monomer (b1), monomer (b2), and monomer (b3) and also acts as an emulsifier in a case where emulsion polymerization is performed.

Examples of the monomers (b3) forming the bifunctional monomer units (b3) include allyl methacrylate, allyl acrylate, divinylbenzene, vinyl methacrylate, vinyl acrylate, trimethylolpropane tri (meth)acrylate, pentaerythritol tri (meth)acrylate, dipentaerythritol hexa (meth)acrylate, tetraethylene glycol di(meth)acrylate, or examples in which the structure of the main chain is a propylene glycol-type with diacrylate or dimethacrylate at both ends (for example, manufactured by NOF Corp., trade name: PDP-200, PDP-400, ADP-200, and ADP-400), tetramethylene glycol type examples (for example, manufactured by NOF Corp., trade name: ADT-250 and ADT-850), and mixed types thereof (for example, manufactured by NOF Corp., trade name: ADET-1800 and ADPT-4000).

In the (meth)acrylic-based adhesive resin (b) according to the present embodiment, the content of the monomer unit (b3) is preferably 0.1% by mass or more and 30% by mass or less when the total of all monomer units in the (meth)acrylic-based adhesive resin (b) is 100% by mass, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (b) according to the present embodiment, the content of the polymerizable surfactant is preferably 0.1% by mass or more and 30% by mass or less when the total of all monomer units in the (meth)acrylic-based adhesive resin (b) is 100% by mass, more preferably 0.1% by mass or more and 15% by mass or less, even more preferably 0.1% by mass or more and 20% by mass or less, and particularly preferably 0.1% by mass or more and 5% by mass or less.

The (meth)acrylic-based adhesive resin (b) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (b) according to the present embodiment includes radical polymerization, anionic polymerization, cationic polymerization, and the like. In consideration of the manufacturing cost of the (meth)acrylic-based adhesive resin (b), the influence of functional groups of the monomer, the influence of ions on the surface of the electronic component, and the like, polymerization by radical polymerization is preferable.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (B) according to the present embodiment preferably further includes, in addition to the adhesive resin (B1), a cross-linking agent (B2) having two or more cross-linkable functional groups in one molecule.

The cross-linking agent (B2) having two or more cross-linkable functional groups in one molecule is used to react with the functional groups having the adhesive resin (B1) and adjust the adhesive force and aggregating force.

Examples of such cross-linking agents (B2) include epoxy compounds such as sorbitol polyglycidyl ether, polyglycerol polyglycidyl ether, pentaerythritol polyglycidyl ether, diglycerol polyglycidyl ether, glycerol polyglycidyl ether, and resorcinol diglycidyl ether; isocyanate compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine compounds such as trimethylolpropane tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-aziridinecarboxyamide), N,N'-toluene 2,4-bis(1-aziridinecarboxyamide), and trimethylolpropane-tri-β-(2-methylaziridine) propionate; tetrafunctional epoxy compounds such as N,N,N',N'-tetraglycidyl-m-xylenediamine, and 1,3-bis(N,N'-diglycidylaminomethyl)cyclohexane; melamine-based compounds such as hexamethoxymethylol melamine, and the like. These may be used alone or in a combination of two or more types.

Among the above, it is preferable to include one type or two or more types selected from epoxy-based compounds, isocyanate-based compounds, and aziridine-based compounds.

Usually, the content of the cross-linking agent (B2) is preferably in a range where the number of functional groups in the cross-linking agent (B2) does not exceed the number of functional groups in the adhesive resin (B1). However, in a case where new functional groups are created in the cross-linking reaction, in a case where the cross-linking reaction is slow, and the like, the content thereof may be greater as necessary.

The content of the cross-linking agent (B2) in the adhesive resin layer (B) is preferably 0.1 parts by mass or more and 10 parts by mass or less with respect to 100 parts by mass of the adhesive resin (B1), and more preferably 0.5 parts by mass or more and 5 parts by mass or less.

The adhesive resin layer (B) according to the present embodiment preferably includes an adhesion-imparting resin in addition to the adhesive resin (B1) from the viewpoint of improving the adhesion to the support substrate. Containing an adhesion-imparting resin in the adhesive resin layer (B) is preferable for facilitating adjustment of the adhesion to the support substrate near room temperature. An adhesion-imparting resin in which the softening point is 100° C. or higher is preferable. Specific examples of adhesion-imparting resins include rosin-based resins such as rosin-based derivatives treated by esterification or the like; terpene-based resins such as α-pinene, β-pinene, dipentene, and terpene phenol; natural rosins such as gum, wood, and tall oil; petroleum resins hydrogenated, disproportionated, polymerized, or maleated with these natural rosins; coumaron-indene resins, and the like.

Among these, examples having a softening point in the range of equal to or more than 100° C. and equal to or less than 160° C. are more preferable and examples having a softening point in the range of equal to or more than 120° C. and equal to or less than 150° C. are particularly preferable. Using an adhesion-imparting resin with a softening point within the above range not only minimizes contamination and glue residue on the support substrate, but also further improves adhesion to the support substrate in a working environment. Furthermore, when a polymerized rosin ester-based adhesion-imparting resin is used as the adhesion-imparting resin, not only are contamination and glue residue on the support substrate minimized, but also adhesion to the support substrate in an environment of equal to or more than 80° C. and equal to or less than 130° C. is improved, and in a case of a heat-expandable adhesive including heat-expandable microspheres, it is possible to more easily carry out the peeling from the support substrate after expansion of the heat-expandable microspheres.

The blending ratio of the adhesion-imparting resin may be appropriately selected such that it is possible to adjust the elastic modulus of the adhesive resin layer (B) within a predetermined numerical range as desired, without being particularly limited. However, in terms of the elastic modulus of the adhesive resin layer (B) and the initial peeling force, 1 to 100 parts by mass with respect to 100 parts by mass of the adhesive resin (B1) is preferable. When the blending ratio of the adhesion-imparting resin is the lower limit value described above or more with respect to 100 parts by mass of the adhesive resin (B1), there is a tendency for the adhesion to the support substrate during work to be favorable.

On the other hand, when the blending ratio is the upper limit value described above or less, there is a tendency for the attachment property to the support substrate at room temperature to be favorable. In terms of the adhesion with the support substrate and the attachment property at room temperature, the blending ratio of the adhesion-imparting resin is preferably 2 to 50 parts by mass with respect to 100 parts by mass of the adhesive resin (B1). In addition, the acid value of the adhesion-imparting resin is preferably 30 or less. When the acid value of the adhesion-imparting resin is the upper limit value described above or less, there is a tendency for it to be difficult for glue residue to be left on the support substrate during peeling.

The adhesive resin layer (B) may include additives such as plasticizers as other components. When the entire adhesive resin layer (B) is 100% by mass, the total content of the adhesive resin (B1), the cross-linking agent (B2), and the adhesion-imparting resin in the adhesive resin layer (B) is preferably 50% by mass or more, more preferably 70% by mass or more, even more preferably 90% by mass or more, and particularly preferably 95% by mass or more. Furthermore, in a case where the adhesive resin layer (B) is formed of a heat-expandable adhesive, when the entire adhesive resin layer (B) is 100% by mass, the total content of the adhesive resin (B1), the cross-linking agent (B2), the adhesion-imparting resin, the gas generating component, and the heat-expandable microspheres in the adhesive resin layer (B) is preferably 50% by mass or more, more preferably 70% by mass or more, even more preferably 90% by mass or more, and particularly preferably 95% by mass or more.

The thickness of the adhesive resin layer (B) is not particularly limited, but, for example, is preferably 5 μm or more and 300 μm or less, and more preferably 20 μm or more and 150 μm or less.

It is possible to form the adhesive resin layer (B), for example, by a method of coating an adhesive coating solution on the base material layer 10, a method of transferring the adhesive resin layer (B) formed on a separator onto the base material layer 10, or the like.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (B) maybe formed by co-extrusion molding or the film-like base material layer 10 and the film-like adhesive resin layer (B) may be formed by laminating.

<Unevenness-Absorbing Resin Layer (C)>

The adhesive film 50 according to the present embodiment has the unevenness-absorbing resin layer (C) between the base material layer 10 and the adhesive resin layer (A) or between the base material layer 10 and the adhesive resin layer (B).

The unevenness-absorbing resin layer (C) is a layer provided for the purpose of making the followability of the adhesive film 50 to the surface of the electronic component 70 on which the uneven structure 75 is formed favorable and making the adhesion between the uneven structure 75 of the electronic component 70 and the adhesive film 50 favorable.

The resin forming the unevenness-absorbing resin layer (C) is not particularly limited as long as the resin exhibits unevenness-absorbing properties, but for example, thermoplastic resins are preferable, and one type or two or more types selected from the group consisting of polyolefin-based resins, polystyrene-based resins, and (meth)acrylic-based resins is more preferable. Furthermore, a resin having a Shore D-type hardness of 50 or less is preferable according to ASTM D-2240 D-type Shore and 40 or less is more preferable.

Even in a case where the resin is not a thermoplastic resin, having the same unevenness-absorbing properties as above is preferable.

The thermoplastic resin according to the present embodiment is not particularly limited as long as the resin is able to form the unevenness-absorbing resin layer (C), and, for example, it is possible to use one type or two or more types selected from olefin-based resins such as an ethylene α-olefin copolymer including ethylene and an α-olefin having 3 to 20 carbon atoms, high-density ethylene-based resins, low-density ethylene-based resins, medium-density ethylene-based resins, ultra-low density ethylene-based resins, linear low-density polyethylene (LLDPE) based resins, propylene (co)polymers, 1-butene (co)polymers, 4-methylpentene-1 (co)polymers, ethylene cyclic olefin copolymers, ethylene α-olefin cyclic olefin copolymers, ethylene α-olefin non-conjugated polyene copolymers, ethylene α-olefin conjugated polyene copolymers, ethylene aromatic vinyl copolymers, and ethylene α-olefin aromatic vinyl copolymers; ethylene carboxylic anhydride copolymers such as ethylene unsaturated carboxylic anhydride copolymers and ethylene α-olefin unsaturated carboxylic anhydride copolymers; ethylene epoxy-based copolymers such as ethylene epoxy-containing unsaturated compound copolymers, and ethylene α-olefin epoxy-containing unsaturated compound copolymers; ethylene (meth)acrylate ester copolymers such as ethylene ethyl (meth)acrylate copolymers, ethylene methyl (meth)acrylate copolymers, ethylene propyl (meth)acrylate copolymers, ethylene butyl (meth)acrylate copolymers, ethylene hexyl (meth)acrylate copolymers, ethylene-2-hydroxyethyl (meth)acrylate copolymers, ethylene-2-hydroxypropyl (meth)acrylate copolymers, and ethylene glycidyl (meth)acrylate copolymers; ethylene and ethylene-unsaturated acid copolymers such as ethylene (meth)acrylic acid copolymers, ethylene maleate copolymers, ethylene fumarate copolymers, and ethylene crotonate copolymers; ethylene vinyl ester copolymers such as ethylene vinyl acetate copolymers, ethylene vinyl propionate copolymers, ethylene vinyl butyrate copolymers, and ethylene vinyl stearate copolymers; ethylene styrene copolymers and the like; unsaturated carboxylic ester (co)polymers such as (meth)acrylic ester (co)polymers; ionomer resins such as ethylene acrylic acid metal salt copolymers and ethylene methacrylate metal salt copolymers; urethane-based resins; silicone-based resins; acrylic acid-based resins; methacrylic acid-based resins; cyclic olefin (co-)polymers; α-olefin, aromatic vinyl compound, and aromatic polyene copolymers; ethylene α-olefin aromatic vinyl compounds; aromatic polyene copolymers; ethylene, aromatic vinyl compound, and aromatic polyene copolymers; styrene-based resins; acrylonitrile, butadiene, and styrene copolymers; styrene conjugated diene copolymers; acrylonitrile styrene copolymers; acrylonitrile, ethylene, α-olefin, non-conjugated polyene, and styrene copolymers; acrylonitrile, ethylene, α-olefin, conjugated polyene, and styrene copolymers; methacrylic acid styrene copolymers; ethylene terephthalate resin; fluorine resins; polyester carbonate; polyvinyl chloride; polyvinylidene chloride; polyolefin-based thermoplastic elastomers; polystyrene-based thermoplastic elastomers; polyurethane-based thermoplastic elastomers; 1,2-polybutadiene-based thermoplastic elastomers; trans-polyisoprene-based thermoplastic elastomers; chlorinated polyethylene-based thermoplastic elastomers; liquid crystalline polyester; polylactic acid, and the like.

Among the above, since the cross-linking is easy due to cross-linking agents such as organic peroxides, it is preferable to use one or two or more selected from olefin-based resins such as ethylene α-olefin copolymers formed of ethylene and α-olefins having 3 to 20 carbon atoms, low-density ethylene-based resins, medium-density ethylene-based resins, ultra-low density ethylene-based resins, linear low-density polyethylene (LLDPE) based resins, ethylene cyclic olefin copolymers, ethylene α-olefin cyclic olefin copolymers, ethylene α-olefin non-conjugated polyene copolymers, ethylene α-olefin conjugated polyene copolymers, ethylene aromatic vinyl copolymers, and ethylene α-olefin aromatic vinyl copolymers, ethylene unsaturated carboxylic acid copolymers such as ethylene unsaturated carboxylic anhydride copolymers, ethylene α-olefin unsaturated carboxylic anhydride copolymers, ethylene and epoxy-containing unsaturated compound copolymers, ethylene, α-olefin, and epoxy-containing unsaturated compound copolymers, ethylene vinyl acetate copolymers, ethylene acrylic acid copolymers, and ethylene methacrylic acid copolymers, and 1,2-polybutadiene-based thermoplastic elastomers.

It is more preferable to use one or two or more selected from ethylene-unsaturated carboxylic acid copolymers such as ethylene α-olefin copolymers formed of ethylene and α-olefins having 3 to 20 carbon atoms, low-density ethylene-based resins, ultra-low density ethylene-based resins, linear low-density polyethylene (LLDPE) based resins, ethylene α-olefin non-conjugated polyene copolymers, ethylene α-olefin conjugated polyene copolymers, ethylene unsaturated carboxylic anhydride copolymers, ethylene α-olefin unsaturated carboxylic anhydride copolymers, ethylene epoxy-containing unsaturated compound copolymers, ethylene, α-olefin, and epoxy-containing unsaturated compound copolymers, ethylene vinyl acetate copolymers, ethylene acrylic acid copolymers, and ethylene methacrylic acid copolymers.

It is even more preferable to use one or two or more selected from ethylene-unsaturated carboxylic acid copolymers such as ethylene α-olefin copolymers formed of ethylene and α-olefins having 3 to 20 carbon atoms, low-density ethylene-based resins, ultra-low density ethylene-based resins, linear low-density polyethylene (LLDPE) based resins, ethylene α-olefin non-conjugated polyene copolymers, ethylene α-olefin conjugated polyene copolymers, ethylene vinyl acetate copolymers, ethylene acrylic acid copolymers, and ethylene methacrylic acid copolymers.

Among the above, it is particularly preferable to use at least one selected from ethylene α-olefin copolymers and ethylene vinyl acetate copolymers. In the present embodiment, the resins described above may be used alone or used in a blend.

As the α-olefin of the ethylene α-olefin copolymer formed of ethylene and an α-olefin having 3 to 20 carbon atoms, which is used as the thermoplastic resin in the present embodiment, usually, it is possible to use one α-olefin having 3 to 20 carbon atoms alone or two or more in combination. Among the above, α-olefins having 10 or less carbon atoms are preferable, and α-olefins having 3 to 8 carbon atoms are particularly preferable. Examples of such α-olefins include propylene, 1-butene, 1-pentene, 1-hexene, 3-methyl-1-butene, 3,3-dimethyl-1-butene, 4-methyl-1-pentene, 1-octene, 1-decene, 1-dodecene, and the like. Among the above, propylene, 1-butene, 1-pentene, 1-hexene, 4-methyl-1-pentene, and 1-octene are preferable due to ease of availability. The ethylene α-olefin copolymer may be a random copolymer or a block copolymer, but a random copolymer is preferable from the viewpoint of flexibility.

The thickness of the unevenness-absorbing resin layer (C) is not particularly limited as long as the thickness is capable of embedding the uneven structure 75 of the electronic component 70, but for example, 10 μm or more and 1000 μm or less is preferable, 20 μm or more and 900 μm or less is more preferable, 30 μm or more and 800 μm or less is even more preferable, and 50 μm or more and 700 μm or less is particularly preferable.

In a case where the uneven structure 75 of the electronic component 70 includes bump electrodes, when the height of the bump electrodes is defined as H [μm] and the thickness of the unevenness-absorbing resin layer (C) is defined as d [μm], H/d is preferably 1 or less, more preferably 0.85 or less, and even more preferably 0.7 or less.

When H/d is the upper limit value described above or less, it is possible to make the unevenness-absorbing property more favorable while making the thickness of the adhesive film 50 thinner.

The lower limit of H/d is not particularly limited, but is, for example, 0.01 or more. The height of the bump electrodes is generally 2 µm or more and 600 µm or less.

Here, according to studies by the inventors of the present invention, it was clear that, the larger the unevenness of the uneven structure 75 of the electronic component 70, the more likely that position shifting of the electronic component or sealing defects will occur in the sealing step. Therefore, when the height of the bump electrode is preferably 10 µm or more, more preferably 20 µm or more, and even more preferably 30 µm or more, it is possible to more effectively obtain the effects of the method for manufacturing an electronic device according to the present embodiment.

<Other Layers>

The adhesive film 50 according to the present embodiment may further be provided with, for example, an easy-adhesion layer or the like between each layer in a range in which the effects of the present embodiment are not impaired.

A description was given above of the embodiments of the present invention, but these are examples of the present invention and it is also possible to adopt various configurations other than the above.

Here, the present invention is not limited to the embodiments described above and modifications, improvements, and the like in a range in which it is possible to achieve the object of the present invention are included in the present invention.

This application claims priority based on Japanese Patent Application No. 2019-046776 filed on Mar. 14, 2019, the entire disclosure of which is incorporated herein.

REFERENCE SIGNS LIST

A: adhesive resin layer
B: adhesive resin layer
C: Unevenness-absorbing resin layer
10: Base material layer
10A: First surface
10B: Second surface
50: adhesive film
60: Sealing material
70: Electronic component
75: Uneven structure
80: Support substrate
100: Structure
200: Electronic device
300: Electronic device
310: Wiring layer
320: Bump
400: Electronic device

The invention claimed is:

1. A method for manufacturing an electronic device, the method comprising at least:
a preparing step of preparing a structure provided with an adhesive film provided with a base material layer, an adhesive resin layer A provided on a first surface side of the base material layer and used for temporarily fixing an electronic component, an adhesive resin layer B provided on a second surface side of the base material layer and in which an adhesive force is reduced by external stimuli, and an unevenness-absorbing resin layer C provided between the base material layer and the adhesive resin layer A or between the base material layer and the adhesive resin layer B, the electronic component attached to the adhesive resin layer A of the adhesive film and having an uneven structure, and a support substrate attached to the adhesive resin layer B of the adhesive film; and
a sealing step of sealing the electronic component with a sealing material,
wherein the uneven structure of the electronic component includes a bump electrode,
wherein, when a height of the bump electrode is defined as H [µm] and a thickness of the unevenness-absorbing resin layer is defined as d [µm], H/d is 0.01 or more and 1 or less, and
wherein the height of the bump electrode is 10 µm or more.

2. The method for manufacturing an electronic device according to claim 1, wherein the unevenness-absorbing resin layer C is provided at least between the base material layer and the adhesive resin layer A.

3. The method for manufacturing an electronic device according to claim 1,
wherein the unevenness-absorbing resin layer includes a thermoplastic resin.

4. The method for manufacturing an electronic device according to claim 1,
wherein a thickness of the unevenness-absorbing resin layer is 10 µm or more and 1000 µm or less.

5. The method for manufacturing an electronic device according to claim 1, further comprising:
a first peeling step of peeling the support substrate from the structure by reducing an adhesive force of the adhesive resin layer B by applying an external stimulus, after the sealing step.

6. The method for manufacturing an electronic device according to claim 5, further comprising:
a second peeling step of peeling the adhesive film from the electronic component, after the first peeling step.

7. The method for manufacturing an electronic device according to claim 1,
wherein the sealing material is an epoxy resin-based sealing material.

8. The method for manufacturing an electronic device according to claim 1,
wherein an adhesive resin forming the adhesive resin layer A includes one or two or more selected from a (meth)acrylic-based adhesive resin, a silicone-based adhesive resin, a urethane-based adhesive resin, an olefin-based adhesive resin, and a styrene-based adhesive resin.

9. The method for manufacturing an electronic device according to claim 1, wherein, a sealing method of the electronic component in the sealing step includes transfer molding, injection molding, compression molding or casting molding.

* * * * *